United States Patent [19]

Ishikawa et al.

[11] Patent Number: 5,588,026
[45] Date of Patent: Dec. 24, 1996

[54] METHOD OF COMPENSATING PHASE SHIFT KEYING FREQUENCY OFFSET

[75] Inventors: Hiroyasu Ishikawa, Tokyo; Hideo Kobayashi, Saitama, both of Japan

[73] Assignee: Kokusai Denshin Denwa Co., Ltd., Tokyo, Japan

[21] Appl. No.: 361,707

[22] Filed: Dec. 22, 1994

Related U.S. Application Data

[63] Continuation-in-part of Ser. No. 66,242, May 25, 1993, abandoned.

[30] Foreign Application Priority Data

Jun. 4, 1992 [JP] Japan ................... 4-168217

[51] Int. Cl.$^6$ ..................... H03D 3/00
[52] U.S. Cl. ............ 375/329; 375/279; 375/344; 329/304
[58] Field of Search ............... 375/279–281, 375/283, 308, 329–332, 344, 345; 329/304, 306; 332/103

[56] References Cited

U.S. PATENT DOCUMENTS

| | | | |
|---|---|---|---|
| 4,652,834 | 3/1987 | McAdam | 329/311 |
| 4,675,882 | 6/1987 | Lillie et al. | 375/345 |
| 4,941,155 | 7/1990 | Chuang et al. | 375/330 |
| 5,173,663 | 12/1992 | Ichiyoshi | 329/306 |
| 5,255,290 | 10/1993 | Anvari | 375/344 |
| 5,263,196 | 11/1993 | Jasper | 375/345 |
| 5,282,228 | 1/1994 | Scott et al. | 329/306 |

OTHER PUBLICATIONS

Publications "Binary Phase–Shift Keying", pp. 245–251, and M–ary Signaling pp. 286–299.
IEEE Journal on Selected Areas in Communications, vol. SAC–5, No. 5, Jun. 1987. "Highly Efficient Digital Mobile Communications With A Linear Modulation Method" pp. 890–895.
IEEE Transactions on Vehicular Technology, vol. 41, No. 1, 1992. "Nonredundant Error Correction Analysis and Evaluation of Differentially Detected π/4—shift DQPSK Systems in a Combined CCI and AWGN Environment", pp. 35–48.
Institute of Electronics and Center for Telecommunications Research, Taiwan: "Timing Recovery Techniques for Digital Cellular Radio with π/4—DQPSK Modulation" pp. 0319–0323.
Publication: "On the Implementation and Performance of Single and Double Differential Detection Schemes; by Marvin K. Simon, and Dariush Divsalar", IEE Transactions On Communications, vol. 40, No. 2, pp. 278–291, Feb., 1992.

*Primary Examiner*—Young T. Tse
*Attorney, Agent, or Firm*—Nikaido, Marmelstein, Murray & Oram LLP

[57] ABSTRACT

A frequency offset compensation method has the steps of raising the detected signal to the M-th power to remove a modulation factor from the received signal, and accumulating the M-th power signals for N (N is an integer) symbols to derive a phase component of the accumulated M-th power signals. Then, the derived phase component is divided into M so as to obtain an estimation value with respect to phase shift due to frequency offset which represents frequency deviation from a true carrier frequency contained in the received signal, and the received signal is multiplied by the obtained estimation value in a form of conjugate complex number to remove the phase shift due to the frequency offset from the received signal.

4 Claims, 5 Drawing Sheets

METHOD OF COMPENSATING PHASE SHIFT KEYING FREQUENCY OFFSET

This application is a continuation-in-part of application Ser. No. 08/066,242 filed May 25, 1993 now abandoned.

BACKGROUND OF THE INVENTION

1. Field of the Invention

The present invention relates to a method of compensating frequency offset of a received phase shift keyed signal which may occur in any of digital mobile radio communication systems such as a digital car telephone system, a digital portable telephone system and a digital cordless telephone system.

2. Description of the Related Art

In a generic phase shift keying system, termed "M-ary Phase Shift Keying" (MPSK), M indicates the number of information phases. Thus, in the case of a Binary Phase Shift Keying System (BPSK) M=2, and in the case of a π/4 Quadrature Phase Shift Keying System (QPSK) and a π/4 Differential Quadrature Phase Shift System (DQPSK), M=4. M is defined as M=$2^N$, where N is an integer larger than zero (N>0).

Recently, various new digital radio techniques have been studied, developed and put to practical use, for the promotion of digitizing land mobile communication systems such as a car telephone system and a cordless telephone system. For example, a π/4 shift QPSK technique, which is one of several phase shift keying methods having high efficiency of frequency usage, will be adopted for use in a digital car telephone system, a cordless telephone system and a portable telephone system of the next generation.

In the case of a land mobile communication system, since its transmission path will be a Rayleigh fading communication path in which the amplitude and phase of the signals change substantially with respect to time, it is quite difficult to carry out a coherent detection, which includes determination of a reference carrier and a phase-shifted and information signal recovered from the received signal.

For the Rayleigh fading communication path, therefore a differential detection (delay detection) method which does not need the recovered reference carrier but detects the phase difference between two symbols may be advantageously used. However, even in this differential detection method, the bit error rate performance will be deteriorated by phase shift due to frequency offset. Such frequency offset might be caused by instability of an oscillator installed in a transmitter/receiver in mobile stations or in base stations. Many studies and developments with respect to compensation of the frequency offset have been carried out. However, according to the conventional art, the construction of the compensation circuit would become complicated and also the compensable amount of frequency offset would be limited to a frequency offset which corresponds to a phase shift of 2π due to phase ambiguity.

In order to suppress the generation of frequency offset itself in a small value, it is necessary to make frequency oscillators in the base stations and in the mobile stations with high accuracy, causing the manufacturing cost of the oscillators to increase.

SUMMARY OF THE INVENTION

It is therefore an object of the present invention to provide a frequency offset compensation method for phase shift keying which uses a differential detection scheme.

Another object of the present invention is to provide a frequency offset compensation method which can eliminate the upper limitation of the compensable amount of the frequency offset.

According to the present invention, a frequency offset compensation method is provided. This method will be adopted in a digital mobile communication system employing a differential detection scheme as a demodulation method. The method has the steps of raising the detected signal to M-th power to produce an unmodulated signal, accumulating such unmodulated signals for a period of N (N is an integer) symbols to derive a phase component of the accumulated signal raised to the M-th power, dividing the derived phase component into M so as to obtain an estimation value with respect to phase shift due to the frequency offset which represents frequency deviation from a true carrier frequency contained in the received signal, and multiplying the received signal by the obtained estimation value in the form of a conjugate complex number to remove from the received signal the phase shift due to the frequency offset.

Accordingly, the frequency offset can be easily compensated which may mostly decrease the bit error rate performance.

However, this compensation method is effective only when the phase shift due to the frequency offset is within a range from −π/M to π/M and thus uncertainty may occur if the phase shift exceeds this range. In other words, since the estimation value of the phase shift is calculated as a value between −π and π, a phase shift larger than π/M contained in the received signal prior to the M-th power operation cannot be detected by this M-th power operation.

Therefore, it is preferred that, at a transmitting side, information phase data sequence to be transmitted is differentially encoded twice. Thus, the phase ambiguity problem of the estimated phase shift can be easily removed without adding complex circuitry.

In the case of a π/4 shift QPSK system, it is preferred that the method has, at a transmitting side, the steps of differentially encoding the information phase data sequence to be transmitted in the form of QPSK to produce a first encoded data sequence, adding π/4 to the first encoded data sequence to produce a π/4 shifted data sequence, and differentially encoding the π/4 shifted data sequence to produce a transmission signal.

Further objects and advantages of the present invention will be apparent from the following description of the preferred embodiments of the invention as illustrated in the accompanying drawings.

DESCRIPTION OF THE PREFERRED EMBODIMENTS

Figure 1:
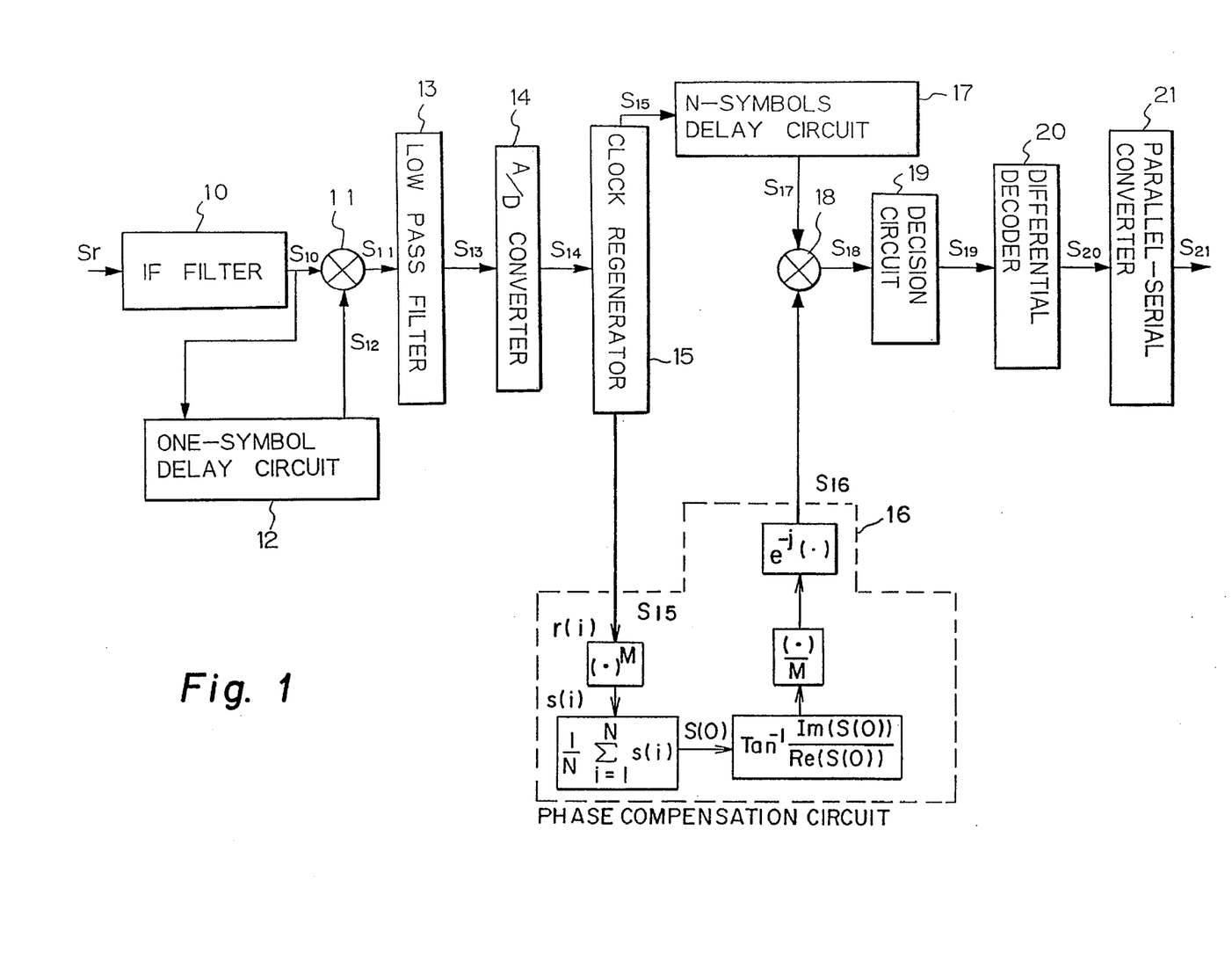
FIG. 1 shows a block diagram of a demodulator at a receiving side as a preferred embodiment according to the present invention.

FIG. 1 shows, as a preferred embodiment of the present invention, a demodulator for demodulating an MPSK (M-Phase Shift Keying) signal wave which has information in the phase difference between two symbols. This demodulator has functions of not only delay detection and differential decoding but also of frequency offset compensation.

In FIG. 1, reference numeral 10 denotes an intermediate frequency (IF) band pass filter, 11 is a multiplier with one input connected to the output of the IF filter 10, and 12 is a one-symbol delay circuit inserted between the output of the IF filter 10 and the other input of the multiplier 11.

A low pass filter 13 is connected to the output of the multiplier 11. To the output of the low pass filter 13, an A/D converter 14 and a clock regenerator 15 are connected in series. A first output of the clock regenerator 15 is connected to a phase compensation circuit 16, whereas a second output of the regenerator 15 is connected to an N-symbols delay circuit 17. The output of the phase compensation circuit 16 is connected to one input of a multiplier 18, and the output of the delay circuit 17 is connected to the other input of the multiplier 18. To the output of the multiplier 18, a decision circuit 19, a differential decoder 20 and a parallel-serial converter 21 are connected in series.

Hereinafter, operation of the device shown in FIG. 1 will be described in detail.

Received signal $S_r$ is applied to the IF filter 10, and then the output signal $S_{10}$ from the filter 10 is multiplied, at the multiplier 11, by a signal $S_{12}$ from the delay circuit 12, which is delayed for one symbol period. Then the multiplied signal $S_{11}$ from the multiplier 11 is applied to the low pass filter 13. By this filter 13, harmonic wave components will be removed from the multiplied signal $S_{11}$ and thus only the baseband component thereof will be outputted as a signal $S_{13}$.

The output signal $S_{13}$ from the filter 13 is applied to the A/D converter 14 which samples the input signal $S_{13}$ a number of times Ns per one symbol period. The output signal from the A/D converter 14 is applied to the clock regenerator 15 so that an optimum sampled value will be detected. The signal $S_{15}$ detected at the optimum sampling point is then applied to the phase compensation circuit 16.

The phase compensation circuit 16 raises the sampled value to M-th power and then accumulates the M-th power values for an N number of N symbols so as to derive the phase component therefrom. Then the phase compensation circuit 16 obtains an estimation value with respect to phase shift amount owing to the frequency offset by dividing the derived phase component by M.

Since the phase compensation circuit 16 uses N symbols for estimating phase shift due to the frequency offset, the output signal $S_{15}$ including information is delayed for N symbol periods by the delay circuit 17 and then applied to the multiplier 18 as a signal $S_{17}$. At the multiplier 18, the signal $S_{17}$ and the output signal $S_{16}$ from the phase compensation circuit 16 are multiplied with each other to produce a multiplied signal $S_{18}$ which will not include any phase shift due to the frequency offset. The signal $S_{18}$ is then applied to the decision circuit 19 and thus precise phase difference information can be obtained.

Hereinafter, the above-mentioned operation with respect to the frequency offset compensation will be theorized.

If r(i) represents a sampled value of the delay detection output r(t) of the received signal at a sampling point $t=iT_s$ (this sampling point is estimated by the clock regenerator 15) and s(i) represents the M-th power of r(i), the sampled value s(i) at the sampling point $t=iT_s$ is given as follows:

$$s(i)=r(i)^M \quad (1)$$

wherein Ts is the length of time necessary for transmitting one symbol (Ts=1/(symbol rate), and i is an optional integer identifying an arbitrary sampling time (for example r (i) represents a differentially detected output signal at i-th sampling time). Since r(i) is raised to the M-th power the information phase component in the MPSK signal wave can be removed so as to derive a value of the phase shift due to frequency offset.

If S(f) represents a frequency response of s(i), S(kf) is given as a discrete Fourier transformation of s(i).

$$S(kf) = \frac{1}{N} \sum_{i=1}^{N} s(i)\exp(j2\pi ik/N) \quad (2)$$

where N represents the number of the symbols expanded by the discrete Fourier transformation (DFT) and k represents the degree of the harmonic wave.

Since the phase shift due to the frequency offset is considered to kept constant for N symbols, it will be appear as a direct current component f=0 Hz on the frequency axis. As the direct current component S(0) of S(f) is given by the next equation (3), an estimation value $\Delta\omega'T_s$ of the phase shift due to the frequency offset can be obtained by the following equation (4).

$$S(0) = \frac{1}{N} \sum_{i=1}^{N} s(i) \quad (3)$$

$$\Delta\omega'T_s = \frac{1}{M} \operatorname{Tan}^{-1} \frac{Im\{S(0)\}}{Re\{S(0)\}} \quad (4)$$

The phase shift due to the frequency offset contained in the received signal can be eliminated by carrying out the following calculation using this estimation value.

$$\begin{aligned} z(i) &= r(i)\exp(-j\Delta\omega'T_s) \\ &= R(i)\exp\{\Delta\omega T_s + \theta(i)\} \cdot \exp(-j\Delta\omega'T_s) \\ &= R(i)\exp\{j\theta(i)\} \cdot \exp\{-j(\Delta\omega - \Delta\omega')T_s\} \end{aligned} \quad (5)$$

where R(i) represents the amplitude component of the differential detection output r(i), θ(i) represents phase difference information at the sampling point $t=iT_s$, and $\Delta f=\Delta\omega/2\pi$ represents a true frequency offset amount, respectively.

As will be apparent from the formula (5), if this estimated offset amount Δω' is substantially equal to the true frequency offset amount Δω, the following relationship will be formed.

$$z(i) \equiv R(i)\exp\{j\theta(i)\} \quad (6)$$

From the equation (6), the phase difference information θ(i) can be precisely detected.

If an estimation value of the phase shift is calculated from the above-mentioned method, ambiguity of the estimated value caused by the M-th power operation may become an issue. In other words, in a case that frequency offset Δω of the received signal is greater than $\pi/MT_s$, there will be an ambiguity α (α is an optional variable satisfying the value π/M>α>0) in the estimated phase shift. If the phase shift $\alpha\omega T_s$ is represented as $$\Delta\omega T_s = \alpha + \pi/M \quad (7)$$

the M-th power value thereof is expressed as follows.

$$M\alpha\omega'T_s = M\alpha + \pi \quad (8)$$

From the equation (4), an estimation value $\alpha\omega'T_s$ of the phase shift is restricted as $-\pi/M < \alpha\omega'T_s < \pi/M$. Thus, this estimation value will be practically calculated, from the equation (7), as $\alpha\omega'T_s = \alpha - \pi/M$. Therefore, the differential detection output of which phase shift due to the frequency offset has been modified by using the equation (5) will have a phase error of $(\alpha\omega - \alpha\omega')T_s = 2\pi/M$, causing the error rate to increase to about ½.

In order to prevent such phase ambiguity in the estimated value of the phase shift owing to the frequency offset from being issued, it is preferred that double differential encoding are performed against the information phase data sequence at the transmitting side.

Figure 2:
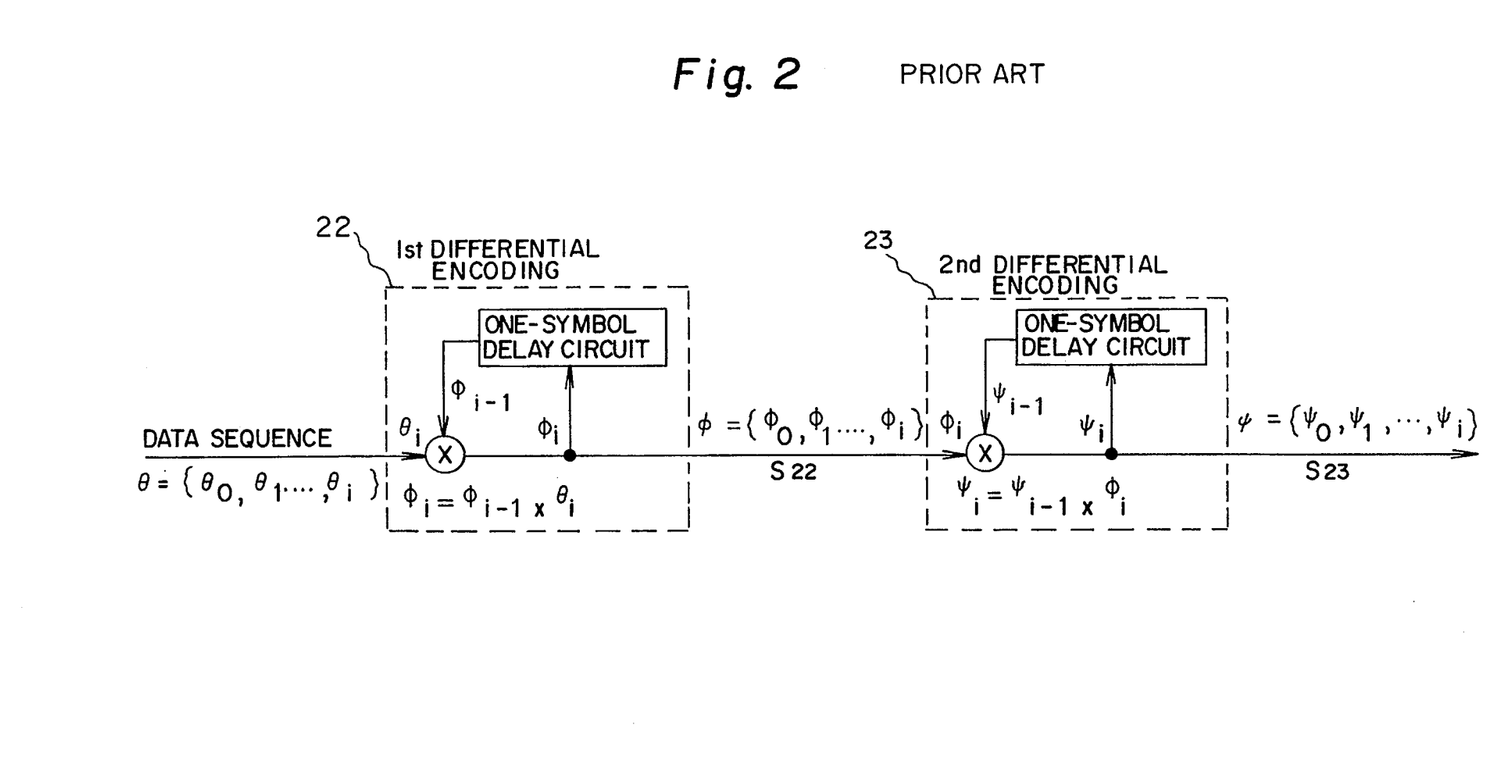
FIG. 2 shows an example of a double differential encoding system at the transmitting side.

FIG. 2 shows an example of a double differential encoding system at the transmitting side. This system is substantially constituted by a first differential encoder 22 and a second differential encoder 23 connected in series. Each of the differential encoders 22 and 23 consists of a multiplier with two inputs and an output, and a one-symbol delay circuit with an input connected to the output of the multiplier and with an output connected to one of the inputs of the multiplier. In each of the encoders, differential encoding is effected by adding a current phase information to a differentially encoded signal prior to one-symbol. It should be noted that if an input signal applied to the differential encoder is represented by $e^{j\phi(t)}$, the multiplier thereof will operate as an adder with respect to its phase component.

Such double differential encoding system is known and, for example, described in "On the Implementation and Performance of Single and Double Differential Detection Schemes", by Marvin K. Simon and Dariush Divsalar, IEEE Transaction on Communication, Vol. 40, No. 2, pages 278–291, February 1992.

Phase information data sequence $\theta = \{\theta_0, \theta_1, \theta_2, \ldots \theta_i\}$ is applied to the first differential encoder 22 to produce a differentially encoded phase information sequence $\phi = \{\phi_0, \phi_1, \phi_2 \ldots \phi_i\}$ (Signal $S_{22}$) represented in an equation (9) which will be described later. Then the signal $S_{22}$ is inputted into the second differential encoder 23 to produce a differentially double encoded phase information sequence $\Psi = \{\Psi_0, \Psi_1, \Psi_2, \ldots \Psi_i\}$ (signal $S_{23}$) represented in an equation (10) which will be described later, and a signal $S_i(t)$ shown in an equation (11), which will also be described later, is transmitted to the receiving side.

At the receiving side, an output signal $S_{19}$ from the aforementioned decision circuit 19 shown in FIG. 1 will be applied to the differential decoder 20 as a differential encoded information phase signal. In the decoder 20, decoding operation as shown in an equation (20) which will be described later is executed and thus the differentially decoded signal $S_{20}$ is outputted as a parallel information data sequence. Finally, the decoded output $S_{20}$ from the decoder 20 is applied to the parallel-serial converter 21 to produce a converted serial information data sequence $S_{21}$.

Hereinafter, the above-mentioned operation with respect to elimination of phase ambiguity will be theorized.

If input information phase data sequence is represented by $\theta = \{\theta_0, \theta_1, \theta_2, \ldots, \theta_i\}$, information phase $\phi_i$ after first differential encoding and information phase $\Psi_i$ after second differential encoding are respectively expressed as follows.

$$\phi_i = \phi_{i-1} + \theta_i \quad (9)$$

$$\Psi_i = \Psi_{i-1} + \phi_i \quad (10)$$

If the transmission signal $S_i(t)$ is represented as $$S_i(t) = A \cos(\omega_c t + \Psi_i) \quad (11)$$

wherein A is an arbitrary factor, a differential detection baseband output $B_i(t)$ which does not contain a harmonic wave component will be represented as follows. It should be noted that this output $B_i(t)$ corresponds to the signal $S_{13}$ from the low pass filter 13 shown in FIG. 1.

$$\begin{aligned}
B_i(t) &= S_i(t) \cdot S_{i-1}(t - T_s) \quad (12)\\
&= A\cos(\omega_c t + \Psi_i) \cdot A\cos\{\omega_c(t - T_s) + \Psi_{i-1}\}\\
&= A^2/2 \cdot \cos(\omega_c T_s + \Psi_i - \Psi_{i-1})
\end{aligned}$$

In order to clarify the equation (12), noise components are ignored.

In the differential detection system, in general, $\omega_c$ and $T_s$ are determined as $\omega_c T_s = 2n\pi$. However, if a frequency offset of $\Delta\omega T_s$ is generated due to instability of the frequency oscillator, the equation (12) will be represented as the following equation (13).

$$B_i(t) = A^2/2 \cdot \cos(\Delta\omega T_s + \Psi_i - \Psi_{i-1}) \quad (13)$$

This equation can be expressed, by using the equation (10), as follows.

$$B_i(t) = A^2/2 \cdot \cos(\Delta\omega T_s + \phi_i) \quad (14)$$

Then $\Delta\omega T_s$ is estimated by multiplying $B_i(t)$ of the equation (14) by M. Since $M\phi_i$ becomes equal to $2n\pi$, the estimation value will be obtained with respect to $M\alpha\omega T_s$. If $\Delta\omega'T_s$ is given as $$\Delta\omega'T_s = \alpha + \pi/M \quad (15)$$

estimation value $MB_i(+)$ will be $M\Delta\omega'T_s = M\alpha + \pi$, and will be represented, by using the modulo $2\pi$, as follows.

$$M\alpha\omega'T_s = -(\pi - M\alpha) \quad (16)$$

Dividing the equation (16) by M, the estimation value D of phase shift due to the frequency offset is obtained as follows.

$$D = -(\pi - M\alpha)/M \quad (17)$$

Using this estimated value D, the equation (14) is compensated as follows.

$$\begin{aligned}
B'_i(t) &= A^2/2 \cdot \cos(\Delta\omega T_s + \phi_i - D) \quad (18)\\
&= A^2/2 \cdot \cos(\alpha + \pi/M + \phi_i + \pi/M - \alpha)\\
&= A^2/2 \cdot \cos(2\pi/M + \phi_i)
\end{aligned}$$

The output phase after the differential detection will be represented as follows.

$$\phi'_i = \phi_i + 2\pi/M \quad (19)$$

The decision output of the information phase data sequence $\theta_i$ after the decoding operation which is opposite to the first differential encoding of the equation (9) will be expressed as follows.

$$\begin{aligned}
\theta_i &= \phi'_i - \phi'_{i-1} \quad (20)\\
&= (\phi_i + 2\pi/M) - (\phi_{i-1} + 2\pi/M)\\
&= \phi_i - \phi_{i-1}
\end{aligned}$$

Accordingly, the frequency offset can be precisely compensated without producing ambiguity of the estimated phase.

Although the above-mentioned double differential encoding method will be utilized in a general phase shift keying (MPSK) system, the present invention can be used also in a π/4 shift QPSK system as follows.

Figure 3:
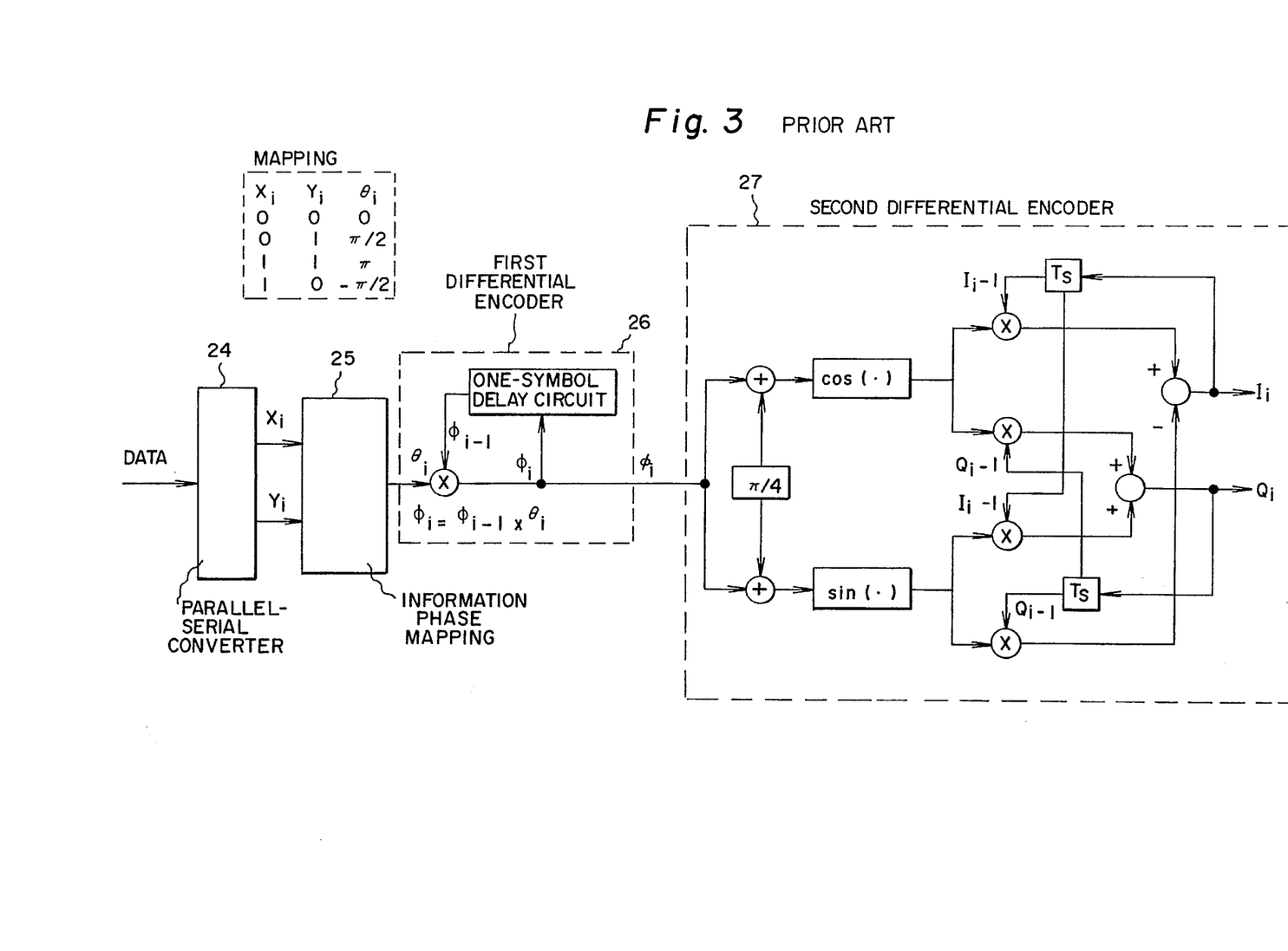
FIG. 3 shows another example of a double differential encoding system at the transmitting side.

FIG. 3 shows another example of a double differential encoding system at the transmitting side. Although the above-mentioned double differential encoding system of FIG. 2 will be utilized in a general M-ary Phase Shift Keying (MPSK) system, this system of FIG. 3 can be used in a π/4 shift Quadrature Phase Shift Keying (QPSK) system.

The double differential encoding system shown in FIG. 3 is constituted by a parallel-serial converter 24, an information phase mapping circuit 25, a first differential encoder 26 and a second differential encoder 27, connected in series.

In the parallel-serial converter 24, input binary information data sequence is serial-parallel converted so as to assign two bits for each symbol, as shown in a part of FIG. 3. Then, in the phase mapping circuit 25, phase information 0, π, and ±π/2 are mapped to each of the symbol as follows:

| $X_i$ | $Y_i$ | $\theta_i$ |
|---|---|---|
| 1 | 1 | π |
| 0 | 1 | π/2 |
| 0 | 0 | 0 |
| 1 | 0 | −π/2 |

Thereafter, the information phase data sequence $\theta_i$ is differentially encoded in the first differential encoder 26 which has the same constitution as that of the differential encoder 22 or 23 in FIG. 2, as follows:

$$\phi_i = \phi_{i-1} \times \theta_i \quad (21)$$

The constitution of the second differential encoder 27 itself is known for example by "Timing Recovery Techniques for Digital Cellular Radio with π/4-DQPSK Modulation", by Ging-shing Liu and Che-Ho Wei, IEEE Int. Conf. Commun. pages 319–323, 1992. In this second differential encoder 27, differential phase $\phi_i$ of the equation (21) is substituted into the next equations, so as to obtain a differentially double encoded π/4 shift QPSK signal.

$$\begin{aligned}
I_i &= I_{i-1} \cos(\phi_i + \pi/4) - Q_{i-1} \sin(\phi_i + \pi/4) \\
&= I_{i-1} \cos\phi_i \cos\pi/4 - I_{i-1} \sin\phi_i \sin\pi/4 - \\
&\quad Q_{i-1} \sin\phi_i \cos\pi/4 - Q_{i-1} \cos\phi_i \sin\pi/4 \\
&= 1/\sqrt{2} \cdot \{(I_{i-1} - Q_{i-1})\cos\phi_i - \\
&\quad (I_{i-1} + Q_{i-1})\sin\phi_i\} \\
Q_i &= I_{i-1} \sin(\phi_i + \pi/4) + Q_{i-1} \cos(\phi_i + \pi/4) \\
&= I_{i-1} \sin\phi_i \cos\pi/4 + I_{i-1} \cos\phi_i \sin\pi/4 + \\
&\quad Q_{i-1} \cos\phi_i \cos\pi/4 - Q_{i-1} \sin\phi_i \sin\pi/4 \\
&= 1/\sqrt{2} \cdot \{(I_{i-1} + Q_{i-1})\cos\phi_i + \\
&\quad (I_{i-1} - Q_{i-1})\sin\phi_i\}
\end{aligned}$$

Such double differentially encoded QPSK signal is transmitted to the receiving side. At the receiving side, the same phase shift compensating operation is performed, and then differential decoding of an equation (23) which is the same as the equation (20) is performed.

$$\theta_i = \phi_i - \phi_{i-1} \quad (23)$$

Figure 4:
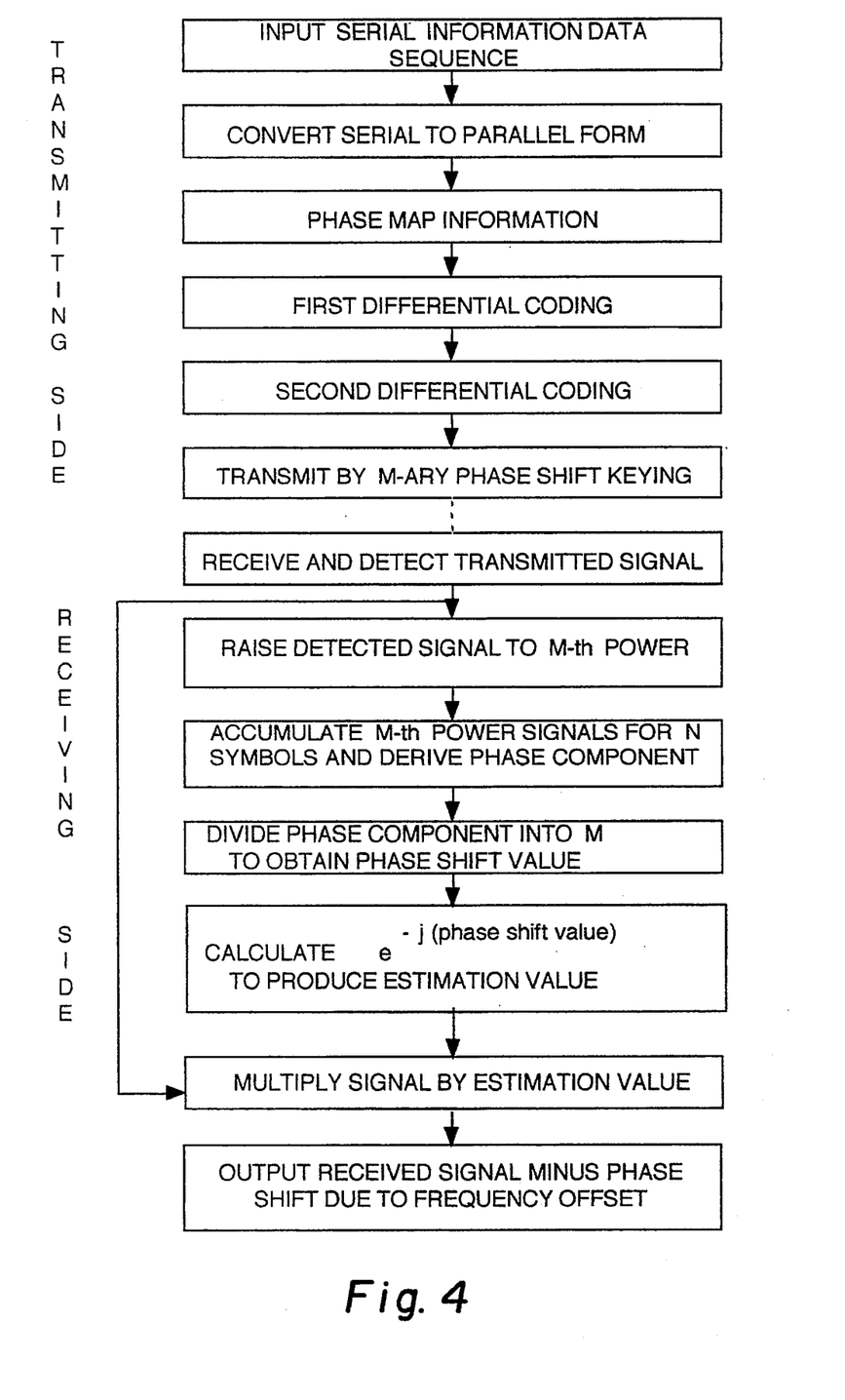
FIG. 4 is a flowchart representing the method performed by a combination of an M-ary double differentially coded transmission as shown in FIG. 2 used with the receiving method of the apparatus shown in FIG. 1.
Figure 5:
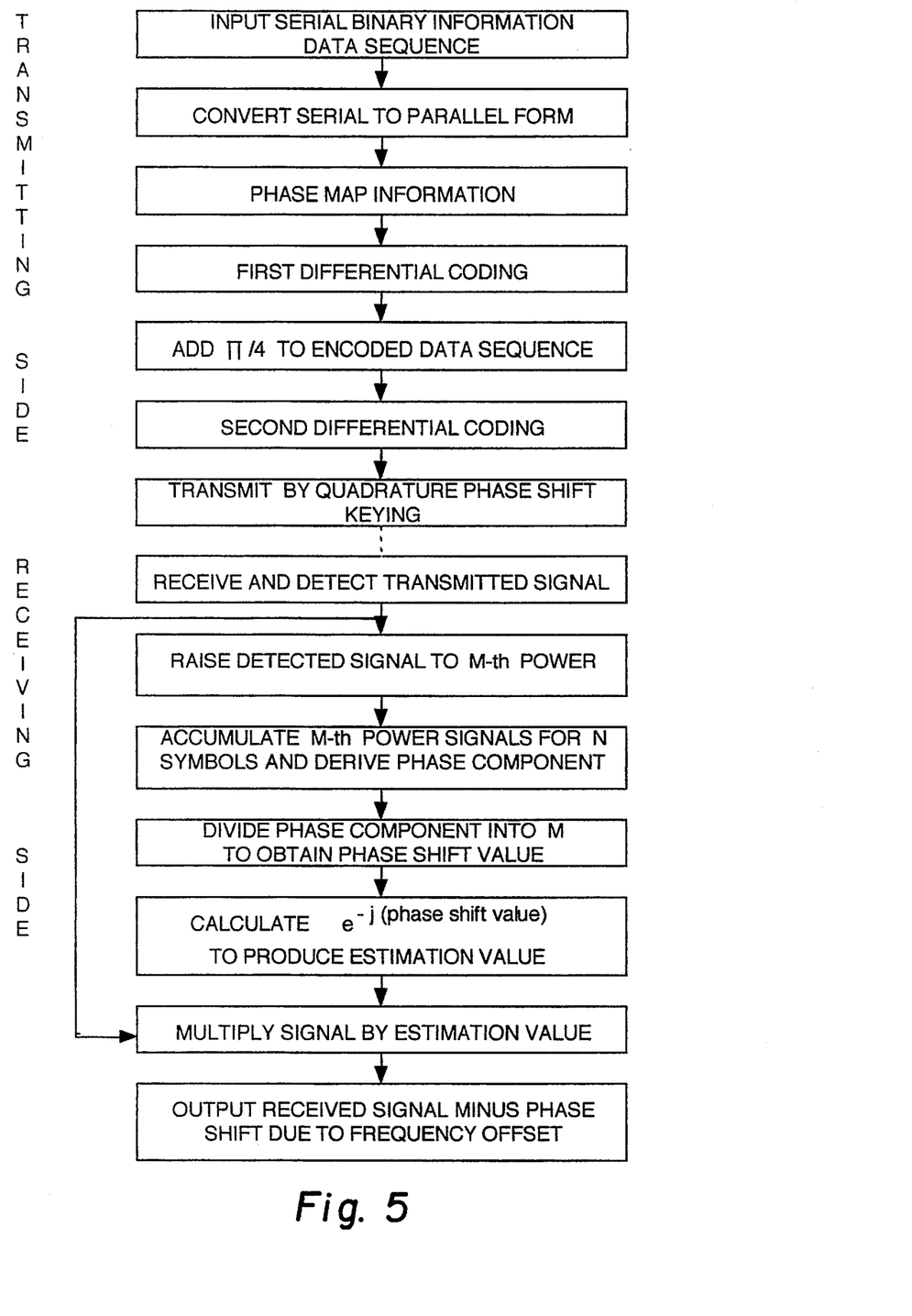
FIG. 5 is a flow chart representing the method performed by a combination of a QPSK transmission used with the receiving method of the apparatus shown in FIG. 1.

FIGS. 4 and 5 are flow charts which show methods performed by communication systems employing, respectively, a general M-ary coded transmission as shown in FIG. 2 and a QPSK transmission shown in FIG. 3.

Thus, the frequency offset can be precisely compensated without producing ambiguity of the estimated phase shift. In other words, the transmitted data sequence can be correctly detected.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of communication including a method of compensating frequency offset in a digital mobile communication system having a differential detection scheme as a demodulation method for demodulating a received digital phase shift keying signal having information encoded in M information phases wherein M is equal to $2^N$ (N is an integer larger than zero) to produce a detected signal, said method comprising the steps of:

detecting said received digital phase shift signal;

raising the detected digital signal to M-th power (M is the number of information phases) producing M-th power signals to remove a modulation factor from said received signal;

accumulating the M-th power signals for N symbols and deriving a phase component of the accumulated M-th power signal;

dividing the derived phase component into M so as to obtain an estimation value with respect to phase shift due to the frequency offset which represents frequency deviation from a true carrier frequency contained in the received signal;

multiplying the received signal by the obtained estimation value in a form of a conjugate complex number to remove phase shift due to frequency offset from the received signal; and demodulating the resultant signal and providing said digital phase shift keying signal to an output device from which keyed information therein can be retrieved.

2. A method of communication comprising, the steps of:

at a transmitting side, differentially encoding an information data sequence to be transmitted as a digital phase shift keying signal having M information phases wherein M is equal to $2^N$ (N is an integer larger than zero) and transmitting said encoded information;

at a receiving side, receiving and detecting said transmitted digital phase shift keying signal;

raising the detected digital signal to M-th power (M is the number of information phases) producing M-th power signals to remove a modulation factor from the received signal;

accumulating the M-th power signals for N symbols and deriving a phase component of the accumulated M-th power signal;

dividing the derived phase component into M so as to obtain an estimation value with respect to phase shift due to the frequency offset which represents frequency deviation from a true carrier frequency contained in the received signal;

multiplying the received signal by the obtained estimation value in a form of a conjugate complex number to remove phase shift due to frequency offset from the received signal; and demodulating the resultant signal and providing said digital phase shift keying signal to an output device from which keyed information therein can be retrieved.

3. The method as claimed in claim 2, wherein said differentially encoding step at said transmitting side is a step of twice differentially encoding said information data sequence.

4. The method as claimed in claim 2, wherein said differentially encoding step at said transmitting side comprises the steps of:

differentially encoding an information phase data sequence to be transmitted in the form of a quadrature phase shift keying to produce a first encoded data sequence;

adding $\pi/4$ to the first encoded data sequence to produce a $\pi/4$ shifted data sequence; and differentially encoding the $\pi/4$ shifted data sequence to produce a transmission signal of $\pi/4$ shift quadrature phase shift keying.

* * * * *